United States Patent [15] 3,638,129
Pryor [45] Jan. 25, 1972

[54] CHOPPER STABILIZED AMPLIFIER

[72] Inventor: Richard Lee Pryor, Cherry Hill, N.J.
[73] Assignee: RCA Corporation

[22] Filed: May 7, 1970
[21] Appl. No.: 35,395

[52] U.S. Cl. ....................................330/9, 330/10, 330/35, 330/51
[51] Int. Cl. ....................................................H03f 3/38
[58] Field of Search ....................330/9, 10, 35, 51; 328/127, 328/151

[56] References Cited

UNITED STATES PATENTS 3,516,002 6/1970 Hillis ................................330/51 UX
3,237,116 2/1966 Skinner et al. ............................330/9
3,516,004 6/1970 Burns ..................................330/35 X
3,518,563 6/1970 Ainsworth ................................330/9

FOREIGN PATENTS OR APPLICATIONS 1,194,908 6/1965 Germany ..................................330/9

*Primary Examiner*—Roy Lake
*Assistant Examiner*—James B. Mullins
*Attorney*—H. Christoffersen

[57] ABSTRACT

Successive levels of a chopped direct voltage input signal are applied to an amplifier during succeeding time intervals. During each such interval a portion of the output signal produced by the amplifier is stored and during each following interval, the stored signal is fed back as an input to the amplifier for stabilizing the voltage reference level at the input terminal.

9 Claims, 3 Drawing Figures

INVENTOR.
RICHARD L. PRYOR
BY H. Christofferson
Attorney

INVENTOR.
RICHARD L. PRYOR
BY H. Christoffersen
Attorney

CHOPPER STABILIZED AMPLIFIER

BACKGROUND OF THE INVENTION

Amplifiers which have input and output choppers which convert direct current (DC) to alternating current (AC) and restore it to DC after amplification are well known in the art, and are frequently used to eliminate the DC drift at the input terminal of the amplifier. Heretofore it has not been practical to integrate such a circuit on a single P-type metal oxide semiconductor (P–MOS) chip. The reason is that there is a space limitation as to the size of a capacitor that may be integrated on a chip, and such an amplifier requires at least an input and an output coupling capacitor.

It is the object of this invention to provide a chopper stabilized amplifier which is free of drift and which is suitable for fabrication on a single P–MOS chip.

SUMMARY OF THE INVENTION

A chopper stabilized amplifier having an input terminal and an output terminal. A difference of potential is applied between third and fourth terminals and means are included for alternately connecting the third and fourth terminals to the input terminal during substantially mutually exclusive time intervals. There are first and second charge storage means, and means are included for connecting the first charge storage means to the output terminal and the second charge storage means to the input terminal during the times the fourth terminal is connected to the input terminal, and for connecting the second charge storage means to the output terminal and the first charge storage means to the input terminal during the times the third terminal is connected to the first terminal.

DETAILED DESCRIPTION

The chopper stabilized amplifier disclosed may be fabricated in integrated form or in discrete form utilizing field-effect transistors.

For ease of illustration, insulated-gate field-effect transistors (IGFET's) of the enhancement type are used to illustrate the amplifier circuit. However, any of the known types of field-effect transistors, e.g., depletion type IGFET's or junction field-effect devices, may be used in the practice of the invention.

The IGFET's of the enhancement type have a first electrode and a second electrode defining a conduction path and a control electrode (gate) whose applied potential determines the conductivity of the conduction path. The first and second electrodes of an IGFET are referred to as the source and drain electrodes. For the P-type IGFET the source electrode is defined as that electrode of the first and second electrodes having the highest potential applied thereto. For an N-type device, the source electrode is defined as that electrode of the first and second electrodes having the lowest potential applied thereto.

For conduction to occur, the applied gate-to-source potential ($V_{GS}$) must be in a direction to forward bias the gate with respect to the source and must be greater in magnitude than a given value which is defined as the threshold voltage ($V_T$). Thus, where applied $V_{GS}$ is in a direction to forward bias the transistor but is lower in amplitude than $V_T$, the transistor remains cutoff and there is substantially no current in the conduction path. In other words, if the power supply voltage does not exceed the threshold voltage ($V_T$) of the transistor, it is impossible to turn the transistor on.

The amplifier is to be described as operating with P-type transistors; however, N-type transistors may be used if proper polarity of the power supply voltages is observed.

Figure 1:
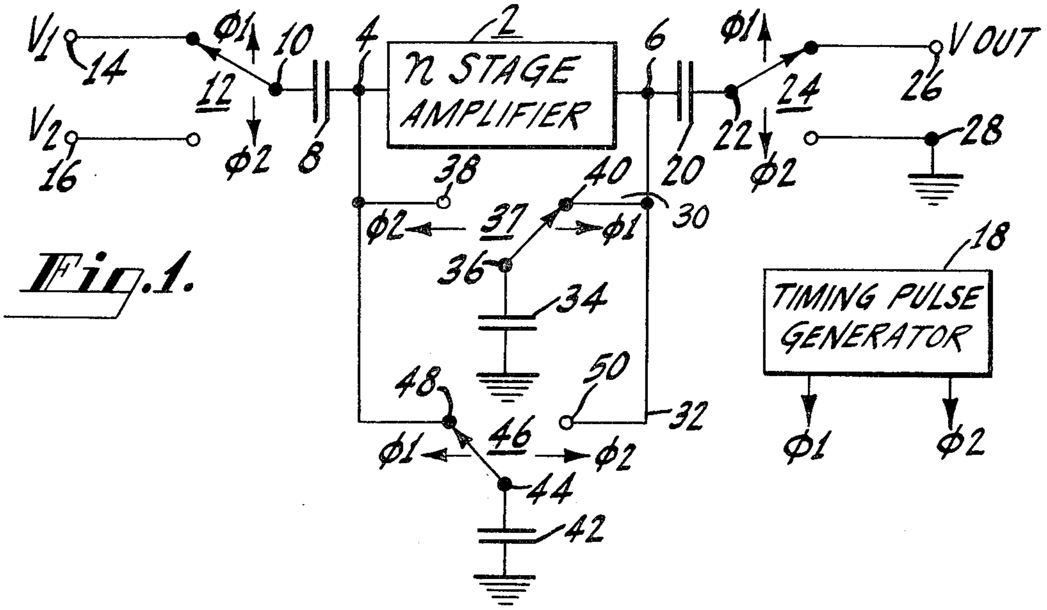
FIG. 1 is a functional schematic representation of the invention.

FIG. 1 is a functional schematic representation of the invention. An *n*-stage amplifier 2, where *n* is an integer, has an input terminal 4 and an output terminal 6. The input terminal 4 is connected, by way of a coupling capacitor 8, to the output terminal 10 of a switch 12 which alternately connects the input terminal of the amplifier to terminals 14 or 16. The input signal it is desired to amplify, $V_1$–$V_2$, is applied between these terminals, where $V_1$ and $V_2$ may be two different voltage levels. For example, $V_1$ may be some direct or slowly varying voltage in the millivolt range and $V_2$ may be ground potential. Terminal 4 is connected to terminal 14 (via capacitor 8 and switch 12) during the intervals $\Delta T_1$ (FIG. 3), that is, during the intervals a periodic timing signal $\phi$1 is more negative than a voltage threshold $V_T$, and is connected to terminal 16 (via capacitor 8 and switch 12) during intervals $\Delta T_2$ (FIG. 3), that is, during the intervals a periodic timing signal $\phi$2 is more negative than the same voltage threshold. Signals $\phi$1 and $\phi$2 are essentially 180° out-of-phase (see FIG. 3) and may be generated by a conventional timing pulse generator 18, which is well known in the art.

The output terminal 6 of the amplifier 2 is connected, by way of a coupling capacitor 20, to the input terminal 22 of a switch 24 which alternately connects the output terminal 6 of the amplifier to terminals 26 or 28 concurrent with the connection of terminal 10 to terminals 14 and 16, respectively. Terminal 28 is connected to a reference potential, for example, ground, which is the reference for $V_1$ and $V_2$. Terminal 26 is the output terminal for the circuit.

First and second transmission paths 30 and 32, respectively, are connected between output terminal 6 and input terminal 4 of the amplifier. The purpose of the transmission paths is to stabilize the operating point of the amplifier. Included in transmission path 30 is a charge storage device such as a capacitor 34 which is connected between circuit ground and one terminal 36 of a switch 37. Terminals 38 and 40 of the switch 36 are connected to input terminal 4 and output terminal 6, respectively, of the amplifier. The capacitor 34 is alternately connected to terminals 4 and 6 by the switch 37 in response to the signals $\phi$1 and $\phi$2. Included in transmission path 32 is a charge storage device such as a capacitor 42 which is connected between circuit ground and one terminal 44 of a switch 46. Terminals 48 and 50 of the switch are connected to input terminal 4 and output terminal 6, respectively, of the amplifier. The capacitor 42 is alternately connected to terminals 4 and 6 by the switch 46 in response to the signals $\phi$1 and $\phi$2.

The operating point of the amplifier is stabilized by feeding back a portion of the output signal of the amplifier to the input terminal to stabilize the proximity between the input and output operating points. There is a leakage of charge at the input terminal of the amplifier, which, in the absence of the transmission paths, tends to maintain the input and output operating points at different levels. The leakage at the input terminal is caused by the back diode leakage between the P region and the substrate of the P-type IGFET's that are used in the amplifier.

In the operation of the circuit of FIG. 1, assume that initially the various switches are in the positions shown. The direct voltage $V_1$ is applied through switch 12 to the *n*-stage amplifier 2 and an amplified version of $V_1$ appears at terminal 6. This amplified signal is applied through the capacitor 20 and switch 22 to the output terminal 26. The signal present at terminal 6 is also fed back via switch 37 to the capacitor 34 and charges the capacitor. The capacitor 42 may be considered to be uncharged for the present.

A short time after the negative portion $\Delta T_1$ of signal $\phi$1 is over, the negative portion $\Delta T_2$ of signal $\phi$2 occurs. This signal condition effectively changes the positions of all switches. Now the charged capacitor 34 is connected through switch 37 to the input terminal 34 so that the capacitor tends to discharge into the $n$-stage amplifier 2. In other words, the signal stored in capacitor 34 during the negative portion $\Delta T_1$ of signal $\phi 1$ is fed back to the input of the amplifier during the negative portion $\Delta T_2$ of signal $\phi 2$. At the same time, the input voltage $V_2$ is being applied through the switch 12 and capacitor 8 to the amplifier 2 so that this signal plus the fed back signal are amplified by the amplifier. The resulting signal produced at terminal 6 is now applied through switch 46 to capacitor 42 and charges the capacitor. During this same interval, the switch 24 connects to ground so that the signal present at 6 does not appear at the output terminal 26.

After another short interval, signal $\phi 2$ goes positive and then the negative portion $\Delta T_2$ of wave $\phi 1$ occurs. The switches revert to their initial position as shown in FIG. 1. Now the charge stored in capacitor 42 is applied to amplifier input terminal 4 and at the same time, the voltage $V_1$ applied to terminal 14 is applied to the $n$-stage amplifier. The resulting output signal produced at 6 is applied to the output terminal 26 via capacitor 20 and also causes the charge remaining on capacitor 34 to be updated. These series of steps continue to be repeated in the manner already described. The overall effect of the feedback is to maintain the input terminal 4 at some average reference level.

Figure 2:
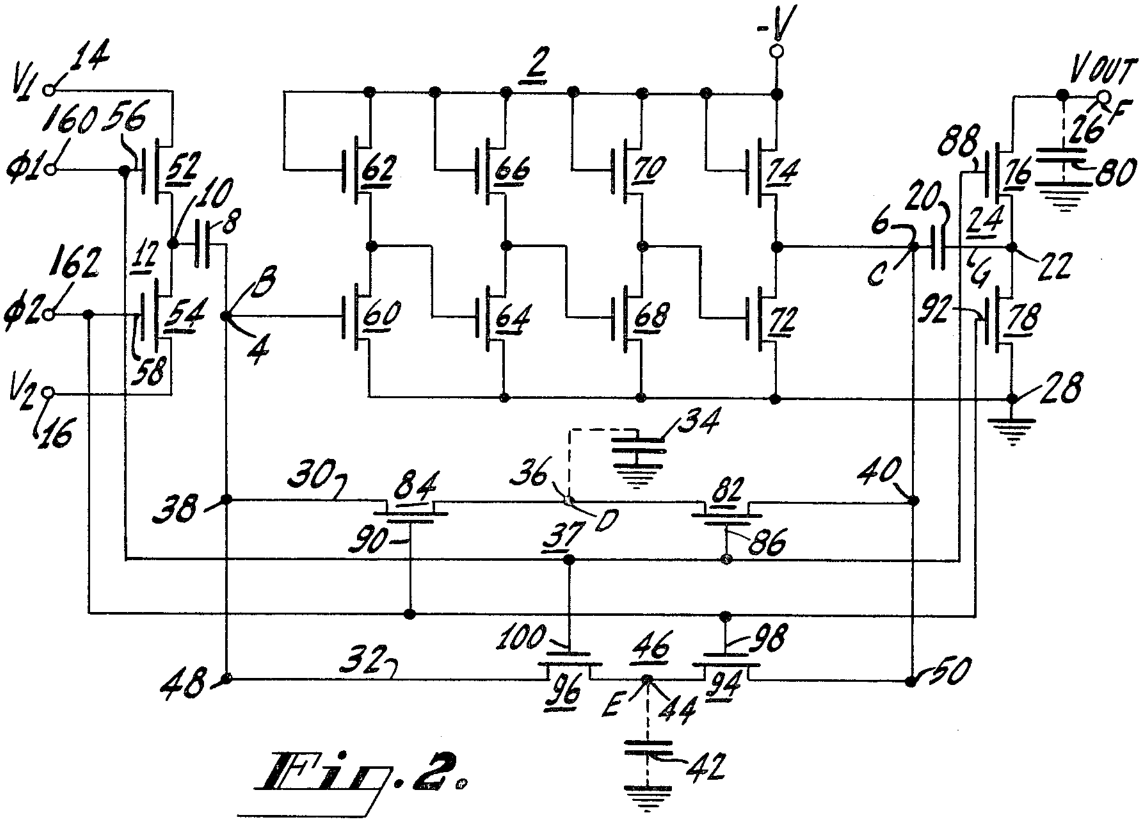
FIG. 2 is a schematic representation of one embodiment of the invention.

FIG. 2 is a detailed schematic of the circuit of FIG. 1 wherein like numerals denote like elements. The switch 12 is comprised of P-type IGFETS's 52 and 54. Gate electrodes 56 and 58 of devices 52 and 54 are connected to terminals 160 and 162, respectively, to which are applied control signals $\phi 1$ and $\phi 2$, respectively. The conduction paths of devices 52 and 54 are connected in common at one end to terminal 10. Terminal 16 is connected to the other end of the conduction path of device 54 and terminal 14 is connected to the other end of the conduction path of device 52.

The $n$-stage amplifier 2 is shown as comprising four stages, however, the amplifier may be constructed of more or less stages dependent upon the needs of the user. The first stage is comprised of a P-type inverter (I) device 60 and a P-type load (L) device 62. The second stage is comprised of a P-type inverter device 64 and a P-type load device 66. The third stage is comprised of a P-type inverter device 68 and a P-type load device 70. The fourth stage comprises a P-type inverter device 72 and a P-type load device 74.

The output terminal 6 of amplifier 2 is connected via the coupling capacitor 20 to terminal 22 of switch 24 which comprises P-type IGFET's 76 and 78. The conduction paths of devices 76 and 78 are connected in common at one end to terminal 22. Terminal 26 is connected to the other end of the conduction path of device 76 and terminal 28 is connected to the other end of the conduction path of device 78. The output capacitance which exists from the substrate to the P region of device 76 is illustrated as a capacitor 80.

Switch 37 in transmission path 30 is comprised of P-type IGFET's 82 and 84. The conduction paths of devices 82 and 84 are connected at one end to terminal 36. The capacitor 34 which is shown in FIG. 1 to be a lumped element, in practice is the distributed capacitance existing between the substrate and common P-region of devices 82 and 84. For this reason, the capacitor is illustrated by dashed lines. The other end of the conduction path of device 82 is connected to output terminal 6 and the other end of the conduction path of device 84 is connected to input terminal 4. The gate electrode 86 of device 82 is connected to terminal 160 and the gate electrode 88 of device 76. The gate electrode 90 of device 84 is connected to terminal 162 and the gate electrode 92 of device 78.

Switch 46 in transmission path 32 is comprised of P-type IGFET's 94 and 96. The conduction paths of devices 94 and 96 are connected at one end to terminal 44. The capacitor 42 which is the distributed capacitance existing between the substrate and common P-region of devices 94 and 96 is connected between terminal 44 and ground. The other end of the conduction path of device 94 is connected to output terminal 6, and the other end of the conduction path of device 96 is connected to input terminal 4. The gate electrode 98 of device 94 is connected to the same points as the gate electrode 90 of device 84 and the gate electrode 100 of device 96 is connected to the same points as the gate electrode 86 of device 82.

In the amplifier 2, the output terminal of the inverter in each stage is directly coupled to the gate electrode of the inverter in the following stage. This results in a linear operating point for each stage of the amplifier providing a means may be devised for maintaining the input and output terminals of the amplifier at approximately the same voltage.

As was pointed out earlier, there is a leakage of charge at the input terminal due to the back diode leakage between the P-region and substrate of the inverter devices. The means for replenishing the lost charge is the feedback of a portion of the output signal via the transmission paths 30 and 32.

By way of example only, the circuit may be considered to be operating at a half clock period of 600 nanoseconds and it may be assumed that capacitors 34 and 42 are each 0.1 picofarad and capacitor 8 is 5.0 picofarads. The amplifier 2 has a gain of 50. It has been found, for the circuit shown, that the leakage current is about 0.05 microamp at the input terminal. If this current is replenished once every clock phase, the operating point of the amplifier is stabilized.

Let $\Delta Q$ be the charge transmitted on each clock phase for a voltage difference $\Delta V$ between the input and output terminals of the amplifier.

$$\Delta V = \Delta Q/C \qquad (1)$$

where $$\Delta Q = (I)(\Delta t) \qquad (2)$$

where $\Delta t$ equals the phase period. Substituting (2) in (1)

$$\Delta V = (I)(\Delta t)/C \qquad (3)$$

$$\Delta V = (0.05 \text{ microamp})(600 \text{ nanoseconds})/0.1 \text{ picofarad}$$

$$\Delta V x 0.3 \text{ volt.}$$

The operating point at the input terminal of the amplifier is then maintained within 0.3 volt of the operating point at the output terminal by feeding back 0.05 microamp of current each clock phase. These calculations are with no signal passing through the amplifier. The mechanism still works in the presence of a signal.

If an even number of stages is used in the amplifier 2, there is a forced delay of one-half clock period between the input and output terminal. As the output signal is going positive a portion of this signal is fed back to the input terminal one-half clock period later at which time the input terminal is going negative. If an odd number of stages is used, the sampled charge reinforces the input signal because of the delay, and as a result there could be a danger of instability because of the positive feedback. This will become clear from the following explanation.

It is a requirement for proper operation of the circuit that there never is a direct connection between the input and output terminal of the amplifier. If there were, an improper amount of charge would be transferred from the output terminal to the input terminal. To prevent such a direct connection from occurring, the devices 82 and 84 in transmission path 30 must never conduct simultaneously and devices 94 and 96 in transmission path 32 must never conduct simultaneously. To insure this, signals $\phi 1$ and $\phi 2$ must never simultaneously be more negative than the threshold voltage ($V_T$) of the P-type devices.

It may be seen (FIG. 3) that at time $t2$, $\phi 2$ reaches $V_T$ and $\phi 1$ has been more positive than $V_T$ for a finite amount of time. Devices 54, 78, 84 and 94 are conductive and devices 52, 76, 82 and 96 are nonconductive. At time $t1$, $\phi 1$ reaches $V_T$ and $\phi 2$ has been more positive than $V_T$ for a finite amount of time $(t3-t)$. Devices 52, 76, 82 and 96 are becoming conductive and devices 54, 84, 94 and 78 are nonconductive. It is seen therefore, that there is never a direct connection from the output to the input terminal as $\phi 2$ goes more positive than $V_T$ at time $t3$ and $\phi 1$ does not go more negative than $V_T$ until a finite time later, $t1$.

Signal $V_1$ (FIG. 3), which is applied to terminal 14 (FIG. 2), is a 40 millivolt direct current (DC) level and $V_2$, which is applied to terminal 16 is a zero volt DC level. These levels are by way of example only and other DC levels or periodic signals may be applied to these terminals.

At time $t2$ (FIG. 3), $\phi 1$ is more positive than $V_T$ and devices 52, 76, 82 and 96 are nonconductive. $\phi 2$ is at $V_T$ and devices 54, 78, 84 and 94 become conductive. Signal $V_2$ is conducted via device 54 through coupling capacitor 8 to the input terminal 4 (waveshape B, FIG. 3). The charge on capacitor 34 (waveshape D, FIG. 3), which was stored the previous half cycle ($\phi 1$ was more negative than $V_T$), is transferred to stabilize the operating point of the amplifier. Since the amplifier 2 has an even number of stages, the signal at the output terminal 6 (waveshape C, FIG. 3) is in phase with the signal at input terminal 4. The signal at terminal 6 is conducted by device 94 to terminal 44 (waveshape E, FIG. 3) for charging capacitor 42 to a level which is a portion of this signal. The signal is also conducted via coupling capacitor 20 to terminal 22 of switch 24, (waveshape G, FIG. 3), and is connected to ground via conducting device 78. Capacitor 80 retains the charge from the previous half cycle and this signal is applied at output terminal 26 (waveshape F, FIG. 3).

At time $t3$, $\phi 2$ goes more positive than $V_T$ and devices 54, 78, 84 and 94 become nonconductive, $\phi 1$ remains more positive than $V_T$ and devices 52, 76, 82 and 96 remain nonconductive. Capacitor 80 retains the previously stored signal.

Figure 3:
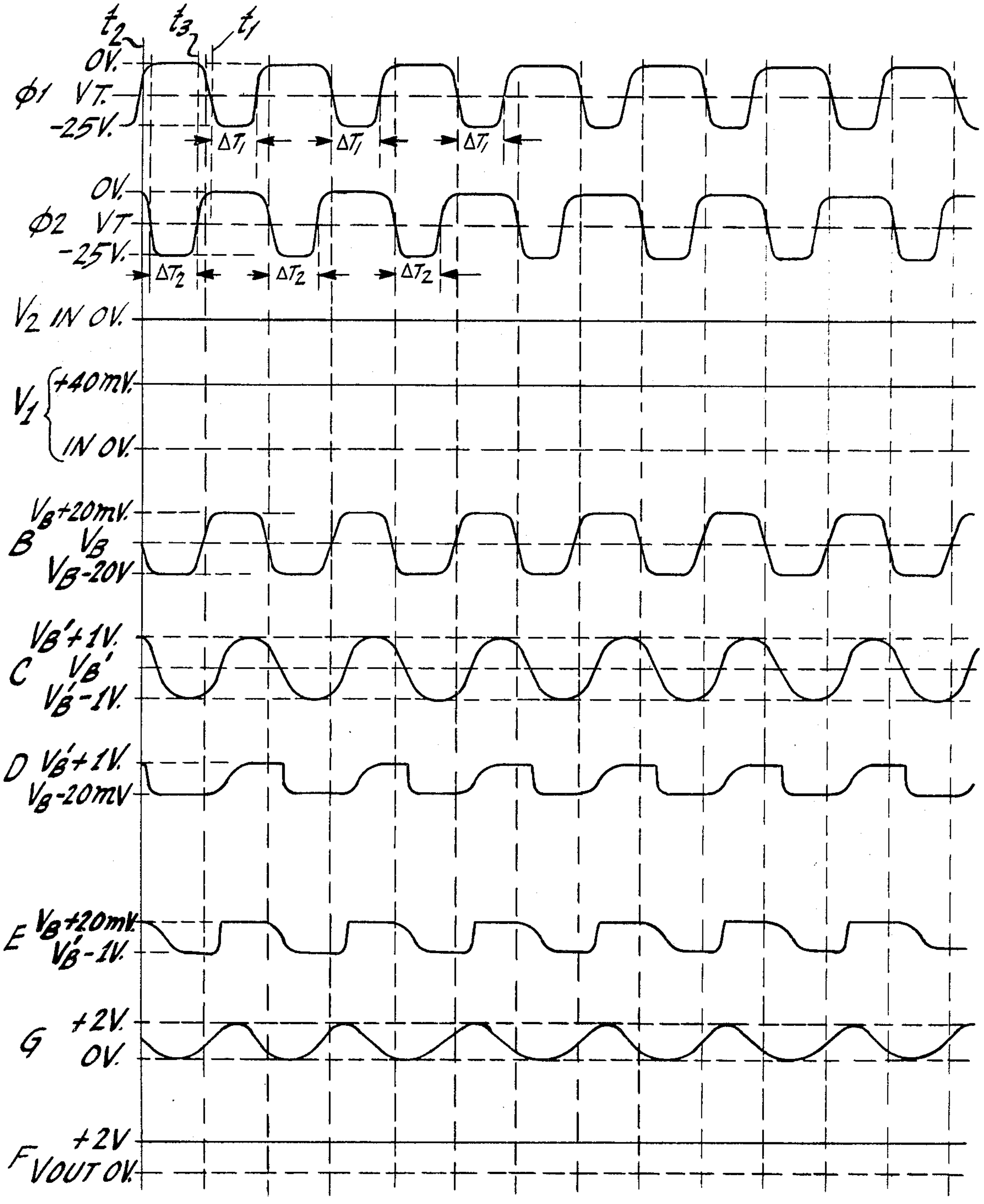
FIG. 3 is a group of waveshapes useful in the understanding of FIG. 2.

At time $t1$, $\phi 2$ remains more positive than $V_T$ and $\phi 1$ reaches $V_T$ such that devices 52, 76, 82 and 96 become conductive. Signal $V_1$ is conducted via device 52 through coupling capacitor 8 to input terminal 4 of amplifier 2. The charge on capacitor 42 (waveshape E, FIG. 3) which was stored during the previous time interval ($t2$–$t1$), is transferred to terminal 4 via devices 96 to stabilize the operating point of the amplifier. The signal at terminal 6 is conducted via device 82 to terminal 37 for charging capacitor 34 to a level which is a portion of this signal. The signal is also coupled via coupling capacitor 20 to terminal 22 of switch 24, and is connected to output terminal 26 via conducting device 76, charging capacitor 80 to the level at output terminal 6. This operation continues for each successive cycle of the clock signals $\phi 1$ and $\phi 2$, as shown in FIG. 3.

Since the input signals are shown as 40 millivolts and 0 volt and the gain of the amplifier is 50, the output signal is 2 volts as derived from the following formula.

$$V\text{out}=(V_2-V_1)G$$

where $G$ equals gain of amplifier 2.

$$V\text{out}=(40\text{ millivolts})(50)=2\text{ volts.}$$

While for purposes of illustration, terminal 16 is stated to be at ground and 14 at some positive value, other values of voltage could be used instead. For example, both $V_1$ and $V_2$ could be positive or $V_1$ could be positive and $V_2$ negative and of the same value as $V_1$ to provide a balanced input. In such instances, the circuit is the equivalent of a balanced DC amplifier.

What is claimed is:

1. A chopper stabilized amplifier comprising, in combination:
   - an amplifier input terminal;
   - second and third terminals across which an input difference in potential may be applied;
   - means for alternately connecting said second and third terminals to said amplifier input terminal during substantially mutually exclusive time intervals;
   - an amplifier output terminal;
   - first and second charge storage means; and
   - means for connecting the first charge storage means to said output terminal and said second charge storage means to said input terminal during the times the second terminal is connected to said input terminal and for connecting the second charge storage means to said output terminal and said first storage means to said input terminal during the times the third terminal is connected to said amplifier input terminal.

2. In combination:
   - an amplifier having an input terminal to which a signal to be amplified may be applied and an output terminal where the amplified signal is manifested;
   - third and fourth terminals to which first and second signals, respectively, may be applied;
   - means for connecting said third terminal to said input terminal during a first periodic time interval;
   - means for connecting said fourth terminal to said input terminal during a second periodic time interval which is different from the first periodic time interval; and
   - a pair of transmission paths connected between said input and output terminals, each of said paths including means for storing a portion of the amplified signal and means for transferring the stored signal to said input terminal, one of said transmission paths storing and the other one of said transmission paths transferring during said first periodic time interval, said transmission paths having the reverse operating roles during said second periodic time interval.

3. The combination claimed in claim 2, including fifth and sixth terminals; and
   - means for applying said amplified signal to said fifth terminal during said first periodic time interval and to said sixth terminal during said second periodic time interval.

4. In combination:
   - an amplifier having an input terminal to which a signal to be amplified may be applied and an output terminal where the amplified signal is manifested; and
   - first and second transmission paths connected between said input and output terminals, each of said first and second transmission paths including storage means for storing a portion of the amplified signal, said storage means in the first transmission path storing a signal in a first given time interval and said storage means in the second transmission path storing a signal in a second given time interval different from the first given time interval, and each transmission path including transfer means for transferring its stored signal to said input terminal, said transfer means in the first path transferring during said second given time interval and said transfer means in the second path transferring during said first given time interval.

5. In combination:
   - means for chopping an input signal to produce a bilevel wave train;
   - an amplifier receptive of said signal for producing an amplified version of said wave train;
   - means for storing a first charge in response to each positive-going portion of the wave train;
   - means for storing a second charge in response to each negative-going portion of the wave train; and
   - means for feeding back to the input to said amplifier during the time it is producing the positive going portions of said wave train, the charge stored during the negative-going portions of the wave train and for feeding back to the input to said amplifier during the time it is producing the negative-going portions of the wave train, the charge stored during the positive-going portions of the wave train.

6. In combination:
   - an $n$-stage amplifier, where $n$ is an integer, having an input terminal to which a signal to be amplified may be applied and an output terminal where the amplified signal is manifested;
   - timing means for generating a first group of periodic timing signals $\phi 1$ and a second group of periodic timing signals $\phi 2$ which is essentially 180° out-of-phase with $\phi 1$;
   - first and second terminals to which first and second input signals may be applied, and means for connecting the first terminal to the input terminal of said amplifier in response to $\phi 1$ and means for connecting the second terminal to the input terminal of said amplifier in response to $\phi 2$;

third and fourth terminals and means for connecting said third terminal to the output terminal of said amplifier in response to $\phi 1$ and means for connecting said fourth terminal to the output terminal of said amplifier in response to $\phi 2$; and first and second transmission paths connected between said input and output terminals, each including means for storing a portion of the amplified signal, said means in the first path storing the signal in response to $\phi 1$ and said means in the second path storing the signal in response to $\phi 2$, and each including means for transferring its stored signal to said input terminal, said means in the first path transferring in response to $\phi 2$ and said means in the second path transferring in response to $\phi 2$.

7. In combination:

an *n*-stage chopper stabilized amplifier, where *n* is an integer, having an input terminal to which a signal to be amplified may be applied and an output terminal at which the amplified signal is manifested;

first and second terminals to which first and second signals may be applied;

means for generating a first group of periodic timing signals $\phi 1$;

means for generating a second group of periodic timing signals $\phi 2$ which is essentially 180° out-of-phase with $\phi 1$;

first and second transistors each having a source, drain, and gate electrode, the source electrode of the first being connected to the drain electrode of the second and to the input terminal of said amplifier, the drain electrode of the first being connected to said first terminal and the source electrode of the second being connected to said second terminal, the gate electrode of the first transistor being responsive to said first group of timing signals, and the gate electrode of the second being responsive to said second group of timing signals;

third and fourth transistors each having a source, drain and gate electrode, the source electrode of the third being connected to the drain electrode of the fourth and to the output terminal of said amplifier, the gate electrode of the third transistor being responsive to said first group of timing signals and the gate electrode of the fourth being responsive to said second group of timing signals;

a third terminal connected to the drain electrode of the third transistor;

a source of reference potential connected to the source electrode of the fourth transistor;

fifth and sixth transistors each having a source and drain electrode, with a conduction path therebetween, and a gate electrode, the conduction paths of said fifth and sixth transistors being connected in series between the input and output terminals of said amplifier, the gate electrode of the fifth being responsive to said first group of timing signals and the gate electrode of the sixth being responsive to said second group of timing signals; and seventh and eighth transistors each having a source and drain electrode, with a conduction path therebetween, and a gate electrode, the conduction paths of said seventh and eighth transistors being connected in series between the input and output terminals of said amplifier, the gate electrode of the seventh being responsive to said first group of timing signals and the gate electrode of the sixth being responsive to said second group of timing signals.

8. In combination:

amplifier means having an input terminal and an output terminal;

first and second transmission paths connected from said output terminal to said input terminal;

each of said transmission paths including storage means and transfer means; and control means connected to each of said transfer means for controlling the operation thereof such that each of said storage means selectively stores or supplies a signal representative of the signal at said output terminal to said input terminal.

9. The combination recited in claim 8 wherein said control means causes each of said transfer means to operate at different times such that the storage means of each of said transmission paths stores or supplies signals at different times, and each of said transfer means includes a semiconductor device.

* * * * *